(12) United States Patent
Kim

(10) Patent No.: US 9,247,680 B1
(45) Date of Patent: Jan. 26, 2016

(54) EMI GASKET FOR SHIELDING ELECTROMAGNETIC WAVE

(71) Applicant: ICH CO., LTD., Gunpo-si, Gyeonggi-do (KR)

(72) Inventor: Young Hun Kim, Gunpo-si (KR)

(73) Assignee: ICH CO., LTD., Gunpo-Si, Gyeonggi (KR)

( * ) Notice: Subject to any disclaimer, the term of this patent is extended or adjusted under 35 U.S.C. 154(b) by 0 days.

(21) Appl. No.: 14/463,320

(22) Filed: Aug. 19, 2014

(30) Foreign Application Priority Data

Jul. 18, 2014 (KR) ........................ 10-2014-0091109

(51) Int. Cl.
*H05K 9/00* (2006.01)
*B32B 37/14* (2006.01)
*B32B 37/24* (2006.01)
*B32B 37/12* (2006.01)

(52) U.S. Cl.
CPC .......... *H05K 9/0015* (2013.01); *B32B 37/1284* (2013.01); *B32B 37/142* (2013.01); *B32B 37/24* (2013.01); *H05K 9/009* (2013.01); *B32B 2037/243* (2013.01); *B32B 2307/212* (2013.01); *B32B 2457/00* (2013.01)

(58) Field of Classification Search
CPC ............................ H05K 9/0015; H05K 9/0088
See application file for complete search history.

(56) References Cited

U.S. PATENT DOCUMENTS

| | | | | |
|---|---|---|---|---|
| 5,045,635 A * | 9/1991 | Kaplo | ...................... | H02B 1/16 174/354 |
| 7,120,005 B1 * | 10/2006 | Luch | .................... | H05K 9/0015 361/220 |
| 2006/0180348 A1 * | 8/2006 | Cloutier | ............... | H05K 9/0015 174/350 |
| 2007/0011693 A1 * | 1/2007 | Creasy | ..................... | C08K 5/49 720/650 |
| 2008/0078574 A1 * | 4/2008 | Kang | ................... | H05K 9/0015 174/358 |
| 2012/0090886 A1 * | 4/2012 | Park | ..................... | H05K 3/3431 174/358 |
| 2014/0097014 A1 * | 4/2014 | Choi | .................... | H05K 9/0015 174/356 |
| 2014/0174813 A1 * | 6/2014 | Doneker | .............. | H05K 9/0088 174/358 |

FOREIGN PATENT DOCUMENTS

KR 20-0208434 Y1 1/2001

\* cited by examiner

*Primary Examiner* — Hung V Ngo
(74) *Attorney, Agent, or Firm* — R. Neil Sudol; Henry D. Coleman

(57) ABSTRACT

A gasket is formed by applying an adhesive on four sides of an elastic body of a closed cell polyurethane material, wrapping a copper film around the elastic body other than a bottom bonding surface, forming a coating layer by depositing or plating nickel on a surface exposing the copper film, and forming a resin coating layer on the nickel coating layer A conductive adhesive is applied on the bottom surface.

9 Claims, 4 Drawing Sheets

EMI GASKET FOR SHIELDING ELECTROMAGNETIC WAVE

CROSS-REFERENCE TO RELATED APPLICATION

This application is based on and claims priority from Korean Patent Application No. 10-2014-0091109 filed on Jul. 18, 2014 in the Korean Intellectual Property Office, the disclosure of which is incorporated herein in its entirety by reference.

BACKGROUND OF THE INVENTION

1. Field of the Invention

The present invention relates to an EMI gasket for shielding electromagnetic waves, and more particularly, to an EMI gasket for shielding electromagnetic waves, which has excellent electromagnetic wave shielding performance.

2. Background of the Related Art

Generally, electromagnetic waves generated by internal circuits of various kinds of electronic devices are radiated to outside through the air or conducted through a power line or the like.

Such electromagnetic waves are known to generate noises and malfunctions in the components or devices in the neighborhood and have a bad effect on human bodies.

As electronic devices are becoming thinner and their circuits are getting complicated recently, possibility of generating electromagnetic waves abruptly increases, and regulations on the electromagnetic waves are strengthened in Korea as well as in developed countries.

Accordingly, conductive sponges are used conventionally so that the electromagnetic waves generated by the circuits of the electronic devices may not be radiated to outside.

However, the conductive sponge is disadvantageous in that since conductive powders are generated, a module risk factor may occur, and its restoring force is low.

In addition, Korean Utility Model Registration No. 20-0208434 discloses a gasket formed by wrapping a copper plate of high conductivity on three sides of an electric conductor, in a general gasket in which four sides of a rectangular elastic body of a polyurethane material are wrapped by a conductor of a PE fiber coated with copper and nickel, and an adhesive tape is attached on the bottom side.

However, since a conductive fabric of a coated fiber is also used in this case and generates conductive powders, a short circuit or a malfunction is worried, and corrosion is also worried since a copper plate is used.

SUMMARY OF THE INVENTION

Accordingly, the present invention has been made in view of the above-mentioned problems occurring in the prior art, and it is an object of the present invention to provide an EMI gasket for shielding electromagnetic waves, which has excellent electromagnetic wave shielding performance without generating a short circuit or a malfunction.

To accomplish the above object, according to the present invention, there is provided an EMI gasket for shielding electromagnetic waves, the EMI gasket formed by applying an adhesive on four sides of an elastic body of a closed cell polyurethane material, wrapping a copper film around the elastic body other than a bottom bonding surface, forming a coating layer on the copper film by depositing or plating nickel, and applying a conductive adhesive on the bottom surface.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 6a is a picture or photographic view showing a result of a salt water spray test performed on test samples of an embodiment of the present invention, while

DETAILED DESCRIPTION OF THE PREFERRED EMBODIMENT

Figure 1:
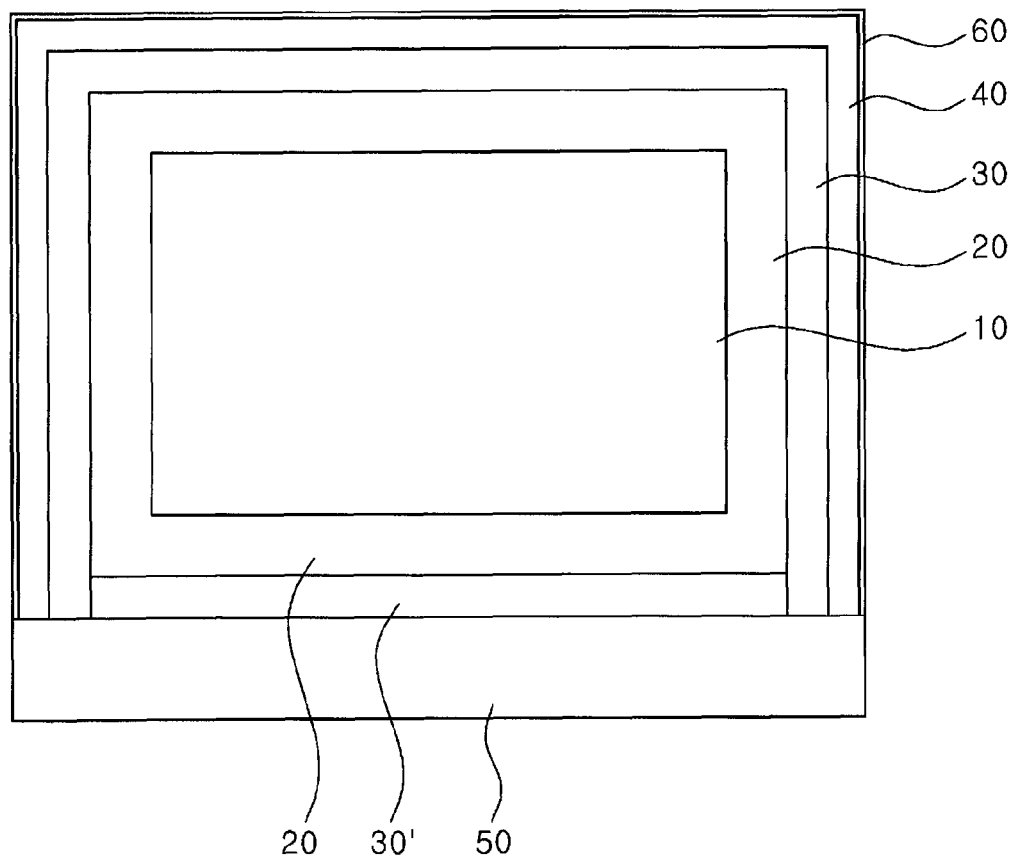
FIG. 1 is a view showing a cross section of a gasket of the present invention.
Figure 2:
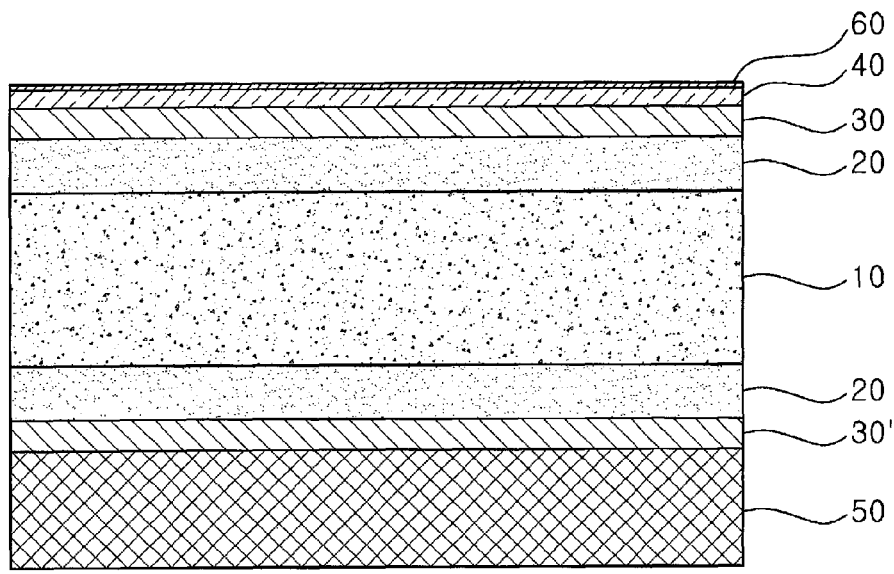
FIG. 2 is a view showing a layered structure of the center portion of a gasket of the present invention.
Figure 3:
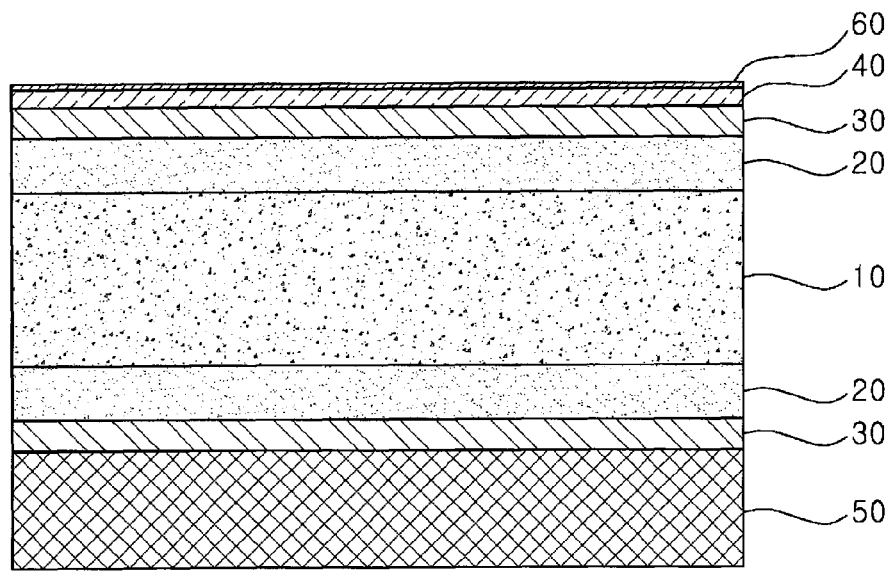
FIG. 3 is a side cross-sectional view showing a layered structure of the side surface of a gasket of the present invention.

FIG. 1 is a view showing a cross section of a gasket of the present invention, FIG. 2 is a view showing a layered structure of the center portion of a gasket of the present invention, and FIG. 3 is a side cross-sectional view showing a layered structure of the side surface of a gasket of the present invention. The base layer 10 in the middle uses a closed cell polyurethane material. The base layer has a thickness of 150 to 250 micrometers. Since a closed cell polyurethane material is used, the entire thickness of the currently and commonly used gasket having a thickness of around 400 to 500 micrometers can be reduced by half. An adhesive layer 20 is applied on four sides including side surfaces and top and bottom surfaces. Thickness of the adhesive layer is generally around 10 micrometers. As shown in FIG. 1, a copper film 30 is attached on all areas other than the center portion of the bottom side which is attached to the apparatus. The copper film is manufactured by laminating a thin film copper plate on a polyester film or by plating or depositing copper on the polyester film. The copper film is formed to have a thickness of less than 10 micrometers, preferably less than 5 micrometers, further preferably less than 3 micrometers, and most preferably 2 micrometers. In order to prevent corrosion of the copper layer, it is preferable to form a nickel layer 40 by coating, depositing or sputtering nickel on all sides other than the bottom surface which is attached to the apparatus. The nickel layer is formed to have a thickness of less than one micrometer, preferably less than 0.5 micrometers, and most preferably 0.3 micrometers.

In addition, an extremely thin resin coating layer 60 is formed to completely prevent corrosion of the copper layer. The resin coating layer is formed to have a thickness less than one micrometer so as not to interfere conductivity. Corrosion of the copper layer can be completely prevented by forming the coating layer. The coating layer is preferably formed using silicon or fluorideresin.

A conductive adhesive layer 50 is formed on the bottom surface which is attached to the apparatus. In order to improve adhesiveness, a conductive non-woven fabric layer 30' may be further formed on the top of the conductive adhesive layer. A conductive material such as nickel, cobalt or the like is coated on the top of the conductive non-woven fabric layer. Damages caused by a short circuit or a malfunction can be reduced compared with a conventional technique using a fabric.

Figure 4:
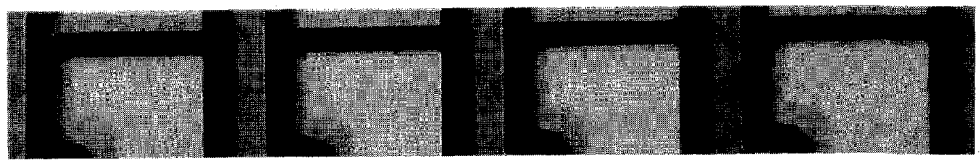
FIG. 4 is a picture showing gaskets of the present invention respectively designed and applied to be appropriate to the shape of a component.

FIG. 4 shows a picture of gasket products of the present invention. The gasket can be freely cut into a shape appropriate to the usage of the product when it is actually used.

Embodiment 1

An adhesive is applied as thick as 10 micrometers on three sides of closed cell polyurethane foam having a thickness of 150 micrometers, and a copper film of 2 micrometers is bonded in the shape as shown in FIG. 1. A gasket having a total thickness of about 200 micrometers is manufactured by applying a nickel coating of 3 micrometers and a fluorideresin coating of 0.5 micrometers on the top and side surfaces and applying a conductive adhesive on the bottom surface as thick as 30 micrometers.

Properties of the product shown in embodiment 1 of the present invention are compared with those of a conventional conductive sponge (comparative example 1), and a result thereof is shown in Table 1. A Toray KP film product is used as the conductive sponge. A restoring force test is performed to measure a restoring force after compressing a test sample by 50%, and the test is performed on a test sample having a size of 25 mm×25 mm at a temperature of 85° C. for 24 hours.

TABLE 1

|  | Embodiment 1 | Comparative example 1 |
| --- | --- | --- |
| Conductive powder | None | Generated |
| Restoring force | 97% | 10% |
| Minimum thickness | 200 | 400 |
| Surface resistance | 0.03/ | 0.1/ |

As is understood from the result shown in Table 1, the product of the present invention does not have a module risk factor since conductive powders are not generated, has a superior sealing force as a gasket since its restoring force is excellent, and is manufactured to be thin, and thus it may contribute to making a thinner and lighter electronic device such as a cellular phone or the like. In addition, since surface resistance is low, electromagnetic wave shielding capability and conductivity of the product of the present invention are superior.

Embodiments 2 to 4

In addition, gaskets are manufactured in the same manner as shown in embodiment 1 while changing thickness of the closed cell polyurethane foam to 200 micrometers, 250 micrometers and 300 micrometers, and restoring forces are measured by applying a load of 400 g at a temperature of 70° C. for 18 hours.

TABLE 2

| Total thickness (T) | Foam thickness (T) | Proper compression rate (based on total thickness) | Compressed thickness (T) | Restored thickness (T) | Restoring rate |
| --- | --- | --- | --- | --- | --- |
| 0.20 | 0.15 | 25% | 0.050 | 0.046 | 30% |
| 0.25 | 0.20 | 24% | 0.060 | 0.054 | 28% |
| 0.30 | 0.25 | 33% | 0.100 | 0.093 | 46% |
| 0.35 | 0.30 | 34% | 0.120 | 0.111 | 48% |
| 0.40 | 0.35 | 40% | 0.160 | 0.150 | 62% |

Test Example 1

A salt water spray test has been conducted on the product of embodiment 1 of the present invention and the products of comparative example 1 and Korean Utility Model Registration No. 20-0208434 (comparative example 2). The test has been conducted using 5% salt water at a temperature of 35° C. for 24 hours. The product of the embodiment of the present invention does not show any change in appearance after the test, and the surface resistance has not been changed since there is no corrosion. Appearances of both the products of comparative example 1 and comparative example 2 are changed due to corrosion, and values of the surface resistance have been considerably increased after the test.

Test Example 2

Figure 5:
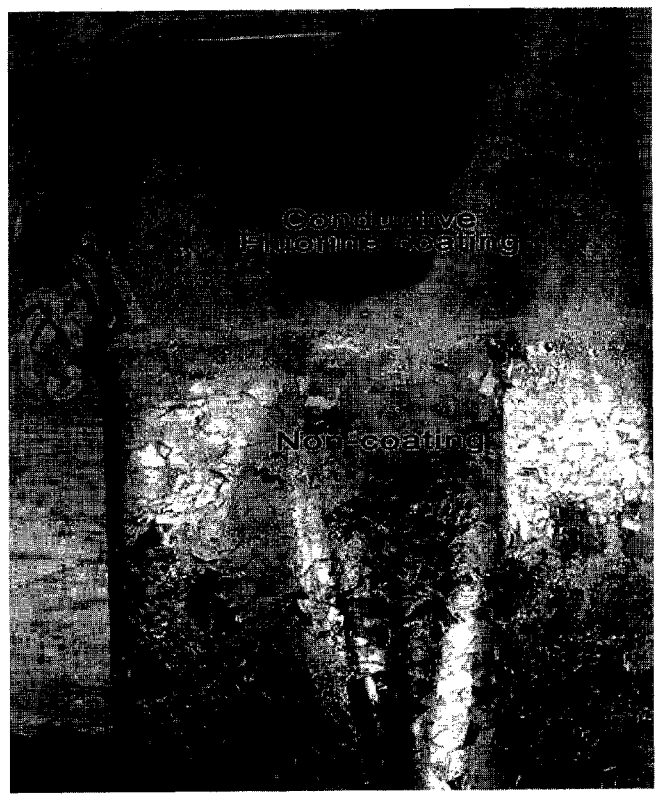
FIG. 5 is a view showing a result of a salt water spray test performed on an embodiment of the present invention and a comparative example.

One half of a sheet is fabricated to be the same as the product of embodiment 3 of the present invention, and the other half is fabricated to be the same as embodiment 3 without a fluorideresin coating process (comparative example 3), and degrees of corrosion are compared after spraying ten liters of 5% salt water at 35° C. for 48 hours. Pictures compared are shown in FIG. 5.

Figure 6A:
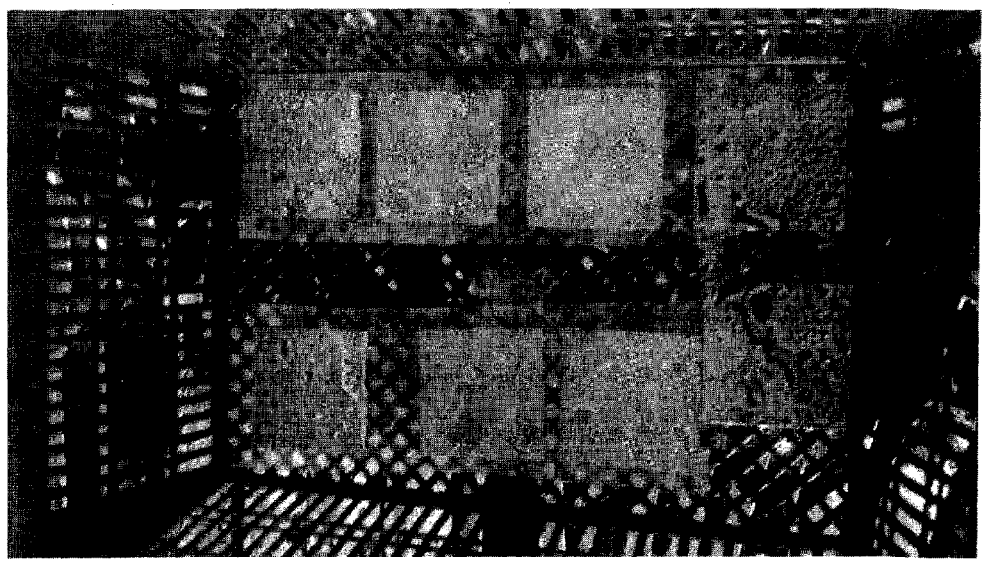
Figure 6B:
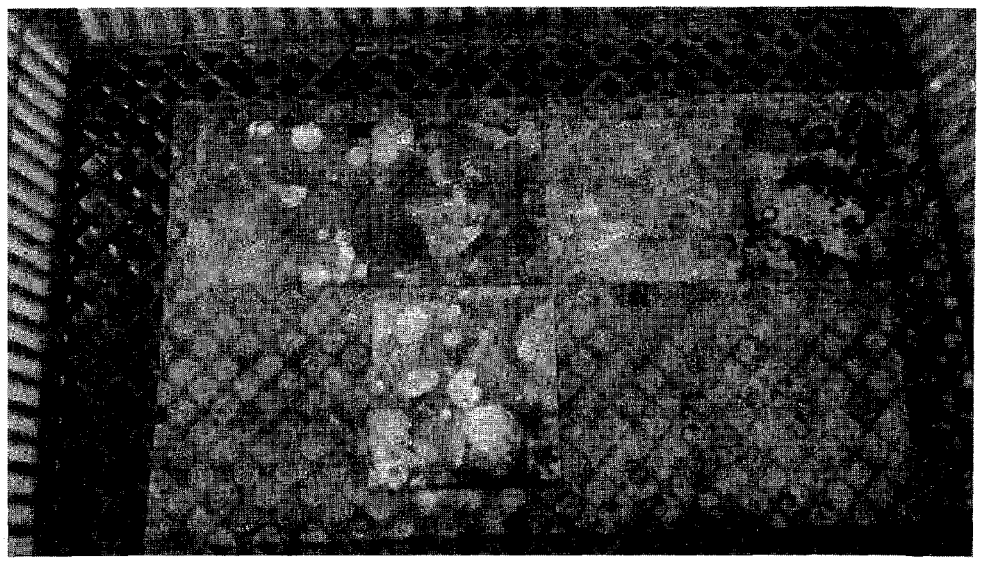
FIG. 6b is a picture or photographic view showing comparative examples.

In addition, pictures of gaskets manufactured as test samples and gone through the salt water spray test are shown in FIG. 6. FIG. 6a shows a picture of products manufactured in embodiment 3, and FIG. 6b shows a picture of products of comparative example 3 respectively manufactured as a test sample and gone through a salt water spray test. It is understood that corrosion preventing performance is remarkably improved by the fluorideresin coating of the present invention.

Furthermore, it is confirmed that the product of the embodiment of the present invention does not show a change in the surface resistance after the salt water is sprayed.

The present invention may drastically decrease thickness of a gasket by using closed cell polyurethane instead of conventional open cell polyurethane.

In addition, oxidation and corrosion of copper can be prevented by depositing or plating nickel on three exposed portions of a copper film.

Furthermore, since a fiber material is not used, conductive powders are not generated, and thus short circuits or malfunctions can be reduced.

The product of the present invention can be advantageously used to shield electromagnetic waves of an electronic device such as a cellular phone or the like. Compared with a conventional product, since the product of the present invention does not generate conductive powders, has a superior sealing force and is manufactured to be thin, it may contribute to making a thinner and lighter electronic device such as a cellular phone or the like. In addition, since surface resistance of the product of the present invention is low, its electromagnetic wave shielding capability and conductivity are superior.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A gasket for shielding electromagnetic waves, the gasket formed by
    applying an adhesive on four sides of an elastic body of a closed cell polyurethane material,
    wrapping a copper film around the elastic body other than a bottom bonding surface,
    forming a nickel coating layer by depositing or plating nickel on a top surface and a side surface where the copper film is exposed,
    forming a resin coating layer on the nickel coating layer, and
    applying a conductive adhesive on the bottom surface.

2. The gasket according to claim 1, wherein the copper film is formed by plating or depositing copper on a polyester film.

3. The gasket according to claim 2, wherein resin of the resin coating layer is fluoride resin or silicon resin.

4. The gasket according to claim 2, wherein a conductive non-woven fabric layer is formed between the conductive adhesive and the adhesive.

5. The gasket according to claim 1, wherein resin of the resin coating layer is fluoride resin or silicon resin.

6. The gasket according to claim 5, wherein the resin coating layer is formed to have a thickness less than one micro meter.

7. The gasket according to claim 1, wherein a conductive non-woven fabric layer is formed between the conductive adhesive and the adhesive.

8. The gasket according to claim 7, wherein the conductive non-woven fabric layer is formed by coating conductive metal on a non-woven fabric.

9. The gasket according to claim 8, wherein the conductive metal is nickel, cobalt or a mixture of these.

* * * * *